United States Patent [19]

Powell et al.

[11] Patent Number: 4,522,845
[45] Date of Patent: Jun. 11, 1985

[54] PROCESS FOR PRODUCING A LAYER OF A METAL SILICIDE BY APPLYING MULTICHROMATIC RADIATION

[75] Inventors: Ronald A. Powell, Redwood City; Ronald T. Fulks, Mountain View, both of Calif.

[73] Assignee: Varian Associates, Inc., Palo Alto, Calif.

[21] Appl. No.: 505,678

[22] Filed: Jun. 20, 1983

[51] Int. Cl.$^3$ .................. H01L 21/285; H01L 21/324
[52] U.S. Cl. .......................... 427/53.1; 204/192 SP; 204/192 S; 204/192 F; 427/55; 427/93; 427/88; 427/91
[58] Field of Search ................. 427/93, 88, 55, 53.1, 427/91; 204/192 SP, 192 S, 192 F

[56] References Cited

U.S. PATENT DOCUMENTS 4,417,347 11/1983 Mulca .................................. 373/158

OTHER PUBLICATIONS

D. R. Nichols, "Co-Sputtered Refractory-Metal Silicides for Wafer-Fabrication Applications", *Microelectronic Manufacturing and Testing*, May 1982.
T. S. Shibata et al., "Metal Silicide Reactions Induced by CW Scanned Laser and Electron Beams," *J. Electrochem. Soc.*, vol. 128, p. 637, 1981.
R. T. Fulks et al., "Rapid Isothermal Annealing of Ion Implantation Damage Using a Thermal Radiation Source," *App. Phys. Lett.*, vol. 39, p. 604, 1981.
D. F. Downey et al., "Activation and Process Characterization of Infrared Rapid Isothermal and Furnace Annealing Techniques," *Solid State Technology*, Sep. 1982, p. 87.
C. J. Russo, "VLSI Applications of Rapid Isothermal Annealing," *Ionics*, Aug. 1982, p. 139.
R. Iscoff, "Wafer Annealing Systems," *Semiconductor International*, Nov. 1981, p. 69.
S. P. Murarka, *Silicides for VLSI Applications*, p. 24–28, Academic Press, 1983.
M. Von Allmen et al., "Laser Quenched Metal-Silicon Alloys," *Laser and Electron-Beam Solid Interactions and Material Processing*, ed. J. F. Gibbons et al., p. 559, 1981.
T. W. Sigmon, "Silicide Formation Using Laser and Electron Beams," *Laser and Electron-Beam Solid Interactions and Material Processing*, ed. J. F. Gibbons et al., p. 511, 1981.
R. T. Fulks et al., "MoSi$_2$ Formation By Rapid Isothermal Annealing," *IEEE Electron Device Letters*, Jul. 1982.
H. J. Geipel, Jr. et al., "Composite Silicide Gate Electrodes-Interconnections for VLSI Device Technologies," *IEEE J. Solid State Circuits*, vol. SC-15, No. 4, Aug. 1980, p. 482.
S. Yanagisawa et al., "Reaction of Mo Thin Films on Si (100) Surfaces," *J. Electrochem. Soc.*, vol. 127, p. 1150, 1980.
T. Y. Tan et al., "Crystallization of Amorphous Silicides By Energy Beam Annealing," *Laser-Solid Interactions and Laser Processing*-1978, ed. S. D. Ferris et al., p. 533, 1979.

*Primary Examiner*—John D. Smith
*Attorney, Agent, or Firm*—Stanley Z. Cole; William R. McClellan

[57] ABSTRACT

Multichromatic radiation is applied rapidly to silicon or polysilicon placed in contact with a silicide-forming metal to form metal silicide having low resistivity without deleterious later diffusion of dopants in adjacent single crystal or polysilicon. The radiation is applied to a metal deposited on silicon or to a metal codeposited with or to silicide deposited from a metal-Si composite target. The temperatures preferably rise to between 600° C. and 1200° C. and the total heating periods are less than about one minute, with 10 to 30 seconds being typical.

19 Claims, 2 Drawing Figures

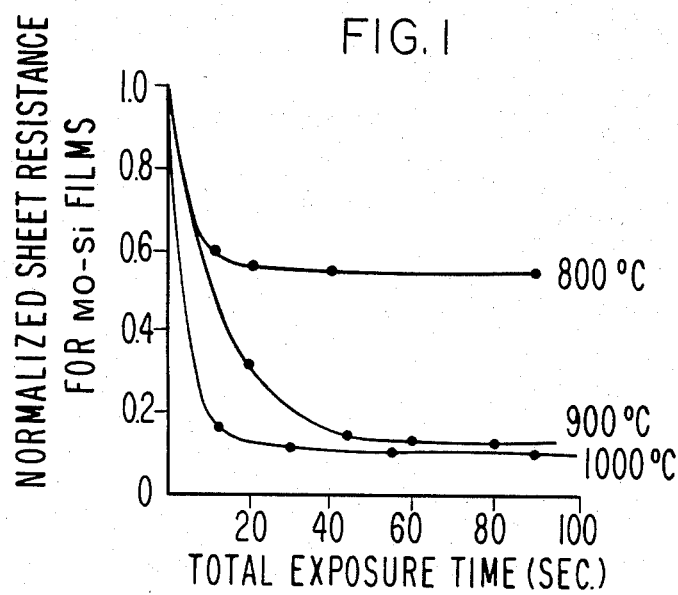
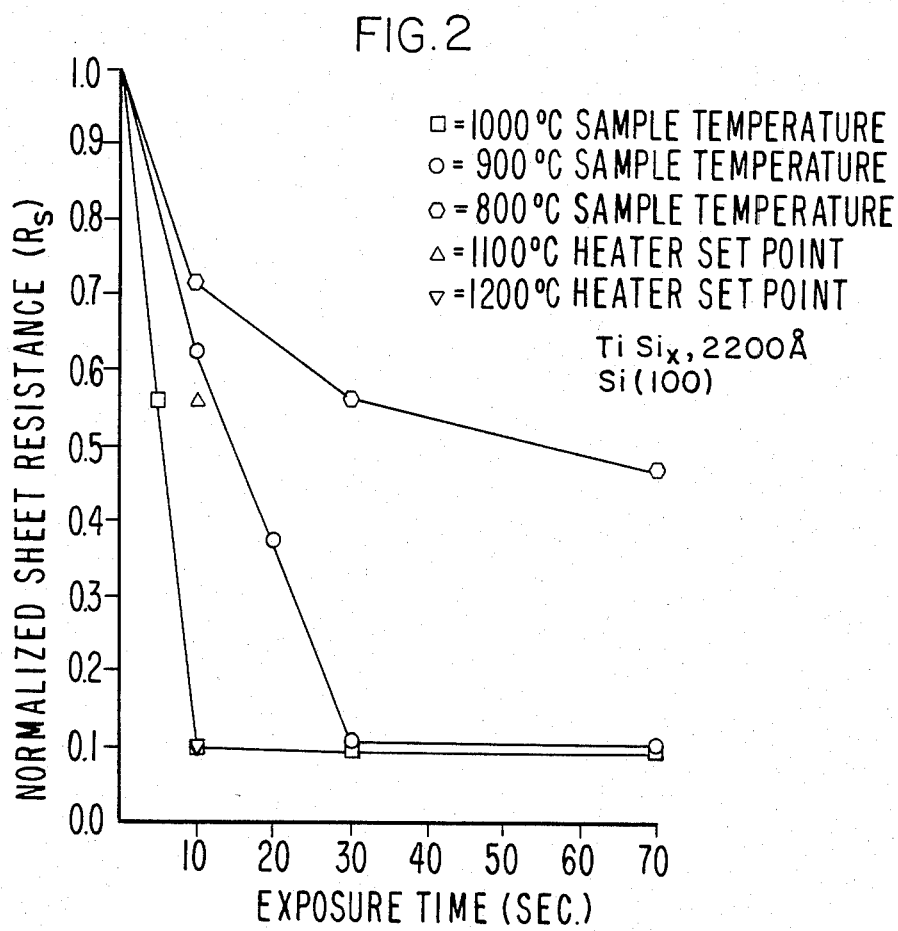

PROCESS FOR PRODUCING A LAYER OF A METAL SILICIDE BY APPLYING MULTICHROMATIC RADIATION

This invention relates to a process for producing a layer of metal silicide and, more particularly, relates to a process for producing a layer of metal silicide by applying multichromatic radiation to silicon or polysilicon which has been brought in contact with a suitable metal or by co-deposition of metal and silicon on a silicon, polysilicon or other substrate.

In the fabrication of semiconductor devices there has been a trend toward forming smaller individual devices and thereby producing a higher density of devices per unit area of silicon real estate. The shrinking size of devices has led to stricter processing requirements. For example, line widths for interconnect lines and other geometric features are approaching submicron levels. In order to satisfy design rules which specify submicron features, it is necessary to have more precise control over diffusion of dopants. Diffusion occurs during processing at elevated temperatures and results in a spreading in all directions from the region where dopant species have been implanted or previously diffused. This diffusion can be especially harmful to certain device yield if it occurs during one of the last processing steps near the end of device fabrication. The lateral component of diffusion adds to the capacitance (Miller capacitance) associated with certain device features. The downward component of diffusion displaces the junctions of devices downwardly, an unacceptable result for shallow junction devices. The extent of such diffusion is related to both the duration of processing and the temperature level during processing. Consequently, there has been a general recognition of the need to both shorten processing times and lower processing temperatures to reduce unwanted diffusion spread of the dopant species.

In forming gates for MOS devices and in applying conductive interconnects to both bipolar and MOS devices the traditional material employed has been either a highly conductive metal, e.g., Al, Au, or Ti or a highly doped polysilicon on an oxide. For very large scale integration (VLSI) the use of refractory metal silicide gates and interconnects, especially for MOS devices, has become most attractive due to its reduced resistivity compared to standard doped polysilicon.

It is also known in MOS devices to replace the doped polysilicon gate electrode with a metal silicide/polysilicon bilayer, i.e., known as a "polycide", providing lowered gate resistance while preserving the well characterized polysilicon gate oxide interface.

However, the production of such compounds in situ by known techniques (furnace anneal, lasers, electrons or ions), requires high temperatures. To produce metal silicide layers for submicron geometric features the processes must necessarily be carried out for short times to avoid the problems described in the previous paragraph.

Furnace annealing produces satisfactory films of refractory metal silicides, but the anneal time is too great and lateral diffusion of dopants too high for VLSI. Focused and scanned lasers and electron beams have been able to form satisfactory metal silicide layers (see T. Shibata, et al, "Metal Silicide Reactions Induced by CW Scanned Laser and Electron Beams", J. Electrochemical Society, v. 128, p. 637, 1981) but they are not suitable for production techniques because high localized temperatures can lead to unacceptably high strain and because excessive time is required to scan uniformly across larger area 4–6" diameter Si wafers. In addition, monochromatic laser radiation is subject to interference effects from dielectric overlayers of varying thickness. Interference effects lead to non-uniform absorption of the radiation and non-uniform heating of the silicon below.

It is therefore an object of the present invention to produce a layer of metal silicide by processing of short duration.

It is another object of the present invention to produce a metal silicide layer by applying multichromatic radiation to silicon or polysilicon placed in contact with a suitable metal.

It is an additional object of the present invention to form a metal silicide layer by using the technique of rapid thermal processing which uniformly heats the entire surface of a wafer.

It is another object of the present invention to produce a layer of a metal silicide without experiencing non-uniformities due to the interference effects associated with monochromatic radiation.

DESCRIPTION OF THE DRAWINGS

FIG. 1 is a family of curves of sheet resistance vs. time for Mo-Si films.

FIG. 2 is a family of curves of sheet resistance vs. time for Ti $Si_x$ films.

SUMMARY OF THE INVENTION

Multichromatic radiation is applied rapidly to a layer of silicon placed in contact with a silicide-forming metal. The radiation is applied uniformly to a metal deposited on silicon or polysilicon or to silicon intermixed with a metal. Preferably, the radiation is applied to the silicon as co-deposited with the silicide-forming metal on Si or on polysilicon as in a polycide gate application. The temperature is uniform across the layer and rises to 600° C. to 1100° C. in approximately 10 seconds and the total heating periods are preferably less than approximately 60 seconds.

DESCRIPTION OF THE PREFERRED EMBODIMENT

The process of the present invention employs multichromatic radiation to produce layers of a metal silicide. The term "multichromatic" is used to describe a radiation source having a broad, substantially continuous spectrum; it is used to distinguish over single wavelength sources (lasers) and over sources having multiple discrete wavelengths. The use of a multichromatic source of radiation typically in a broad beam permits the rapid and uniform heating of the whole layer of silicon which is placed in contact with suitable metals to thereby produce the silicide layer. As used in this application hereafter, the term "silicon" means either single crystal or polycrystalline, unless the specific structure is stated. The whole layer is being processed simultaneously so that there are no lateral inhomogeneities in the film. The energy delivered by the radiation comes from different wavelengths so that for any given film thickness there will not be severe interference effects. It has been found, for example, that monochromatic radiation was reflected rather than absorbed when the thickness of the films was a specific multiple of the wavelength of the monochromatic radiation. This periodically slowed the growth of the film and could lead to excessive film stress when the interfering overlayer thickness varied laterally since a thermal gradient would be generated across the surface of the film or across the interface between the film and the substrate. As described in detail in the ensuing paragraphs, the layer is formed without raising the temperature so high that the diffusion coefficient is unacceptably high and without continuing processing for such a period that the extent of lateral diffusion is great. In general, the diffusion coefficient is given by an expression of the form.

$$D = D_o e^{-E/kt}$$

The extent of diffusion is given by $$X = (2Dt)^{\frac{1}{2}}$$

where
T = temperature, °k
t = time

Thus, in theory a high temperature step for a short time or a low temperature step for a long time are equivalent in respect to minimizing lateral diffusion.

Mixtures of silicon and metal applied to a surface at room temperature are typically unreacted, and have no long term order. Silicide films from a composite silicide source which are deposited on a substrate at room temperature are amorphous or have very small grains leading to excessively high resistivity. It appears desirable to promote the growth of grains up to a satisfactory mean diameter or, ideally, into a single crystal film. The technique described herein uses the same equipment as that recently described for annealing ion implantation damage in silicon (R. T. Fulks, et al, "Rapid Isothermal Annealing of Ion Implantation Damage Using a Thermal Radiation Source", App. Phys. Lett., v. 39, p. 604, 1981). These articles describe equipment and processes for heat treating doped semiconductors at high temperatures for short times to improve damage to crystal structure caused by ion implanters. Briefly, wafers are rapidly exposed in a vacuum (from slightly subatmospheric down to approximately $10^{-6}$ torr) to the blackbody radiation produced by a planar graphite heater/radiator which produces a relatively constant planar energy flux. Exposure times are typically less than 60 seconds. For a 1200° C. heater temperature, the wafer will rise from ambient to a maximum of 1000° C. in about 10 seconds. See also D. F. Downey, et al, "Activation and Process Characterization of Infrared Rapid Isothermal and Furnace Annealing Techniques", Solid State Technology, Sept. 1982, p. 87; C. J. Russo, "VLSI Applications of Rapid Isothermal Annealing", August 1982, p. 139; and R. Iscoff, "Wafer Annealing Systems", Semiconductor International, November 1981, p. 69. When repairing ion implantation damage using RIA, due to the short high temperature exposure, the diffusion of dopants is minimized. Maximum wafer temperatures as measured by an optical pyrometer were 800° C.–1000° C. and total exposure times were 12–90 sec. The rise times to reach equilibrium temperatures for 800° C.–1000° C. was found to vary between 1–10 seconds, primarily due to the increased power density needed, and also to the larger silicon free carrier absorption at the higher temperatures. In some runs, wafers were exposed with the deposited layers facing away from the heater to avoid reflectivity losses. However, in other runs, successful silicide films were formed using frontside irradiation; in production frontside irradiation would be the norm.

Silicides by definition are compounds formed between a metal and silicon. Those compounds which are particularly suited for low resistance ohmic electrical contacts and interconnects or for gates in MOS devices are the silicides of W, Ta, Ti and Mo in stoichiometries more or less metal:silicon equal to 1:2. (PtSi forms Schottky barriers because of its high Schottky barrier heights). This suitability arises principally from their ability to form under reasonable conditions of formation and from their low contact resistance. See S. P. Murarka, "Silicides for VLSI Applications", p. 24, et seq, Academic Press, (1983).

Silicides can be formed in various ways by sintering a thin metal-silicon composite. Formation of the composites can be accomplished by any of the following techniques:

(1) Depositing a metal on silicon or polysilicon; by sputtering, evaporation or electroplating
(2) Cosputtering metal and silicon on silicon, polysilicon, or oxide in a desired ratio, from two independent targets
(3) Sputtering on silicon, polysilicon, or oxide from a hot-pressed composite metal-silicon target
(4) Coevaporating on silicon, polysilicon, or oxide silicon and a metal from a two-filament or double e-gun evaporator
(5) Chemical vapor deposition, at atmospheric or subatmospheric pressures, of the silicide on silicon, polysilicon, or oxide.

The first technique (1) is least preferred since it does not mix more than the surface layer of the silicon and metal prior to sintering. Each of the techniques (2) to (5) get better atomic interaction or starts with a mixture of the silicon and metal. The following examples describe several of the preferred techniques.

Molybdenum Co-Sputtered with Silicon on Single Crystal Silicon Substrate

The substrates were first sputter cleaned by argon to remove native oxides. For co-sputtered layers, the reduction in sheet resistance vs. radiant energy exposure time at various temperatures is displayed by the family of curves such as in FIG. 1. The initial sheet resistance of the deposited layers was 55 ohms/square. It can be seen that rapid isothermal treatment with a dwell time of only 20 seconds at 1000° C. reduces the sheet resistance by a factor of 10. These reductions are comparable to furnace processing requiring much longer periods of time (see H. J. Geipel, Jr., et al, "Composite Silicide Gate Electrodes Interconnections for VLSI Device Technologies", IEEE J. Solid State Circuits, v. SC-15, p. 482, 1980). It is believed that growth of $MoSi_2$ begins in the first few seconds and that the largest percentage reduction in layer resistivity occurs during that time. The sheet resistance uniformity within a 3 in. diameter wafer was typically ±2% for processing 20 seconds at 1000° C., but was somewhat higher at lower temperatures.

$TiSi_x$ Sputtered from Composite Target on Both Single Crystal and Polycrystalline Si The lowest sheet resistance of refractory metal silicides is possessed by titanium disilicide, $TiSi_2$. Thus, it is a prime candidate for use in VLSI applications. Realistically, stoichiometrically precise samples of titanium disilicide will not be produced on a production basis;

TiSi$_x$ is a more accurate designation for the films herein described with x being about 2.5. FIG. 2 shows the ratio of as-deposited sheet resistance for films deposited on single crystal Si from a Ti-Si composite target to that obtained after rapid processing as a function of time for sample temperatures of 800° C., 900° C. and 1000° C. The resistivity was measured with a 4-point probe. At 1000° C. after only 10 seconds, the sheet resistance, R$_s$, has been reduced by a factor of 10, to an absolute value of 1 ohm/square or 22 micro ohms-cm. The decrease is less rapid, but remains significant, for lower temperatures. The sheet resistance is uniform to better than ±1%. We have found that the ultimate sheet resistances can be affected by bias voltage applied to the substrate during processing. In general:

(1) The lowest Rs are obtained with zero bias voltage;
(2) Bias voltages of about −100 v give the highest values of Rs, as much as 20% greater than obtained with zero bias; and
(3) Rs changes very little with bias voltage above −300 v.

TaSi$_2$ Deposited from Composite Target on Single Crystal Si

A 2500 Å film of TaSi$_2$ was deposited on top of Si wafers at 6 microns argon pressure. Depositions were carried out at room temperature and at 300° C. wafer temperature. Next, the wafers were rapidly heated at 1200° C. heater temperature for 20 seconds using a device manufactured by Varian Associates, Inc. and designated as the IA-200 ™ Rapid Isothermal annealer. The as-deposited sheet resistances ranged from 10-11 ohms/square for the sheet deposited at a substrate temperature of 300° C. to a range of 12-13 ohms/square for the sheet deposited at a substrate temperature of 20° C. After the inventive treatment, both wafers exhibited sheet resistances of about 3 to about 4 ohms/square.

Electron diffraction and TEM analysis were done on various co-sputtered Mo-silicide samples processed by the irradiation technique at 800° C. for 20 seconds, at 1000° C. for 12 seconds, and some were furnace processed at 1000° C. for 15 minutes. The as-deposited untreated films showed an amorphous electron diffraction pattern and a negligible grain size. Those samples which were furnace treated were similar in sheet resistivity to those rapidly heated according to the invention at 1000° C. for 12 seconds. Samples made by the inventive process exhibiting average grain size greater than 1000 Å with some grains being formed as large as 5000 Å. For MoSi$_2$, electron diffraction indicated the presence of only the tetragonal MoSi$_2$ phase. However, the electron diffraction pattern for the 800° C. for 20 seconds treated sample is that of the hexagonal MoSi$_2$ phase, which has also been observed for low-temperature furnace treatment (see S. Yanagisawa et al, "Reaction of Mo Thin Films on Si (100) Surfaces", J. Electrochemical Society, v. 127, p. 1150, 1980). The small grain size, 100-200 Å, for this sample contributes to its higher resistivity.

The formation by rapid radiation treatment of this invention, e.g., for a few seconds, enables low-resistivity, large-grained films of refractory metal silicides and may be extended to the following silicides with the same benefit of minimal diffusion of dopants which may exist in adjacent single crystal or poly-Si:

TABLE III

Lowest Eutectic Temperatures of Some Silicides of Interest

| Silicide | Lowest Binary Eutectic Temperature (°C.) | Composition (at % Si) |
|---|---|---|
| TiSi$_2$ | 1330 | 86 |
| ZrSi$_2$ | 1355 | 90 |
| HFSi$_2$ | 1300 | 91.8 |
| VSi$_2$ | 1385 | 97 |
| NbSi$_2$ | 1295 | 95 |
| TaSi$_2$ | 1385 | 99 |
| CrSi$_2$ | 1300 | 87 |
| MoSi$_2$ | 1410 | 97 |
| WSi$_2$ | 1440 | 99.2 |
| FeSi$_2$ | 1208 | 73 |
| CoSi$_2$ | 1195 | 23 |
| NiSi$_2$ | 966 | 46 |
| Ru$_2$Si$_3$ | 1370 | 83 |
| RhSi | | |
| Pd$_2$Si | 720 | 45 |
| ReSi$_2$ | 1125 | 90 |
| OsSi$_2$ | | |
| IrSi$_3$ | | |
| PtSi | 830 | 23 |

Work is currently in progress to evaluate this technique on polycide gate MOS test structures where refractory metal silicides are deposited over doped polysilicon, which polysilicon had been deposited on a gate oxide grown on a silicon substrate. Here, removal of source-drain implantation damage and sintering of the silicide is brought about by a single rapid isothermal irradiation exposure. This should produce a reduced tendency to lose phosporous or other volatile dopants by out diffusion. This rapid isothermal method thus appears to offer a simple, practical approach to minimizing high-temperature wafer exposure in a variety of integrated-circuit processing steps with a potentially high throughput and yield, and excellent uniformity and without the need to move wafer and radiation source relative to one another during the exposure.

In order to verify that silicides could be rapidly sintered and at the same time implanted dopants activated without significant diffusion, the following experiment was carried out. An Si(100) wafer was first implanted with 60 kev As+ and then 2000 Å of TiSi$_2$ was sputtered over the implanted surface. A rapid isothermal, multichromatic irradiation of the wafer (110 seconds for heater temperature at 1200° C.) was then performed. The silicide exhibited the expected low sheet resistivities and the distribution of As⊕ showed minimal dopant redistribution.

What is claimed is:

1. A process for forming a layer of a metal silicide, comprising:
   providing a source of multichromatic radiation;
   forming a contact region between silicon and a silicide-forming metal; and
   directing an intense beam of multichromatic radiation from said source to said silicon and said silicide-forming metal in an evacuated chamber at a power level and for a time sufficient to cause formation of a relatively large grain metal silicide and a reduction in sheet resistivity relative to the untreated contact region by a factor of about three or greater, said contact region being raised to a temperature greater than 800° C. for a time on the order of 60 seconds or less.

2. A process for forming a metal silicide layer in accordance with claim 1 wherein said step of contacting silicon with a metal is accomplished by the step of mixing silicon with said metal.

3. A process for forming a layer of metal silicide in accordance with claim 2 wherein said step of contacting silicon with a metal is accomplished by the step of depositing metal on a silicon surface.

4. A process in accordance with claim 3 wherein said step of depositing a metal on a silicon surface is accomplished by the step of depositing a silicide-forming metal on a surface of single crystal silicon.

5. A process for forming a layer of a metal silicide in accordance with claim 3 wherein said step of depositing metal on a silicon surface is accomplished by the step of depositing a silicide-forming metal on a surface of polycrystalline silicon.

6. A process for forming a metal silicide layer in accordance with claim 2 wherein said step of mixing silicon with said metal is accomplished by the step of simultaneous codeposition of silicon and metal.

7. A process for forming a metal silicide layer in accordance with claim 6 wherein said step of mixing silicon with said metal is accomplished by the step of sputtering from a composite metal silicide target.

8. A process for forming a metal silicide layer in accordance with claim 2 wherein said step of mixing silicon with said metal is accomplished by the step of co-evaporating silicon and a metal from separate sources.

9. A process for forming a layer of a metal silicide in accordance with claim 1 or 2 wherein said step of providing a source of multichromatic radiation is accomplished by the step of providing a radiator having a relatively uniform energy flux characteristic across a broad bandwidth of IR and visible spectrum.

10. A process for forming a layer of a metal silicide in accordance with claim 9 wherein said silicon is a polycrystalline silicon.

11. A process for forming a layer of a metal silicide in accordance with claim 9 wherein said step of directing multichromatic radiation from said source is accomplished by the step of directing multichromatic radiation for a time in the range of 10 to 30 seconds.

12. A process for forming a layer of a metal silicide on a semiconductor wafer comprising:

forming on said semiconductor wafer a contact region between silicon and a silicide-forming metal;

providing a source of multichromatic radiation having a generally uniform planar energy flux characteristic across a broad bandwith of IR and visible spectrum, said source being positioned in an evacuated processing chamber;

introducing said semiconductor wafer into said processing chamber; and exposing said silicon and said silicide-forming metal to radiation from said source at a power level and for a time selected to cause formation of a relatively large grain metal silicide and a reduction in sheet resistivity relative to the untreated contact region by a factor of about three or greater, said contact region being raised to a temperature greater than greater than 800° C. for 60 seconds or less.

13. The process as defined in claim 12 wherein said silicon and said silicide-forming metal are exposed to said multichromatic radiation for a time in the range of 10 to 30 seconds.

14. The process as defined in claim 12 wherein the power level and time of treatment with said radiation are selected to reduce the sheet resistivity of said metal silicide by a factor of about ten or greater.

15. The process as defined in claim 14 wherein said contact region is formed by cosputtering of molybdenum and silicon on a single crystal silicon substrate and wherein said contact region is raised to a temperature of about 1000° C. for at least 20 seconds.

16. The process as defined in claim 14 wherein said contact region is formed by sputtering of $TiSi_x$ where x is about 2.5 from a composite target on silicon and wherein said contact region is raised to a temperature above 900° C.

17. The process as defined in claim 16 wherein said contact region is raised to a temperature of about 1000° C. for at least 10 seconds.

18. The process as defined in claim 12 wherein said contact region is formed by cosputtering of molybdenum and silicon on a single crystal silicon substrate and wherein said contact region is raised to a temperature above 900° C.

19. The process as defined in claim 12 wherein said contact region is formed by deposition of $TaSi_2$ from a composite target on a single crystal silicon substrate and wherein said contact region is raised to a temperature of about 1200° C. for at least 20 seconds.

* * * * *